United States Patent
Hammond et al.

(10) Patent No.: US 11,812,579 B1
(45) Date of Patent: Nov. 7, 2023

(54) RACK INTERLOCK AND ANTI-TIPPING MECHANISM

(71) Applicant: ZT Group Int'l, Inc., Secaucus, NJ (US)

(72) Inventors: Mark Alan Hammond, Secaucus, NJ (US); Jared Scott Harlan, Secaucus, NJ (US); Ryan Signer, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/242,821

(22) Filed: Apr. 28, 2021

(51) Int. Cl.
*H05K 7/14* (2006.01)
*E05B 65/464* (2017.01)
*E05B 65/463* (2017.01)
*A47B 88/50* (2017.01)

(52) U.S. Cl.
CPC .......... *H05K 7/1489* (2013.01); *A47B 88/50* (2017.01); *E05B 65/463* (2013.01); *E05B 65/464* (2013.01)

(58) Field of Classification Search
CPC .. H05K 7/1489; H05K 7/1411; H05K 7/1408; H05K 5/0221; H05K 5/0217; A47B 88/423; A47B 88/427; A47B 88/43; A47B 88/50; A47B 2097/008; H01L 21/6734; E05B 65/46; E05B 65/464; E05B 65/462; E05B 65/465; E05B 65/463; E05B 65/468; G06F 1/18
USPC .................................................. 361/679.02
See application file for complete search history.

(56) References Cited

U.S. PATENT DOCUMENTS

| 3,454,320 | A | * | 7/1969 | Olree | E05B 65/465 312/217 |
| 3,881,793 | A | * | 5/1975 | Anderson | E05B 65/465 312/276 |
| 3,900,236 | A | * | 8/1975 | Goulish | E05B 65/464 312/217 |
| 4,298,236 | A | * | 11/1981 | Laroche | E05B 65/464 312/215 |
| 4,452,498 | A | * | 6/1984 | Wood, Jr. | E05B 65/465 312/220 |
| 4,772,078 | A | * | 9/1988 | Bowyer | E05B 65/464 312/220 |

(Continued)

FOREIGN PATENT DOCUMENTS

EP 0815776 A1 * 1/1998 ........... E05B 65/464

*Primary Examiner* — Adrian S Wilson
*Assistant Examiner* — Gage Crum
(74) *Attorney, Agent, or Firm* — Dergosits & Noah LLP; Todd A. Noah

(57) ABSTRACT

An apparatus is provided for locking rack-mounted electronic devices within a rack upon removal of one of the electronic devices from the rack. The apparatus includes a shaft rotatably connected to the rack and provided at each slot position with a set of paddles, including a locking paddle and a trigger paddle. With the rack populated with devices, the removal of one device from a slot causes a block attached to the device to urge against a trigger paddle, which rotates the shaft. As the shaft continues to rotate, with the motion of the block caused by the removal of the device, the locking paddle for each slot is rotated into a position such that an attempt to remove any of the other devices from the rack causes the associated block to abut the locking paddle, which does not yield.

14 Claims, 8 Drawing Sheets

(56) References Cited

U.S. PATENT DOCUMENTS

| | | | | |
|---|---|---|---|---|
| 4,960,309 A * | 10/1990 | Scheerhorn | ........... | E05B 65/464 312/221 |
| 5,056,876 A * | 10/1991 | Scheerhorn | ........... | E05B 65/464 312/221 |
| 5,333,949 A * | 8/1994 | McGregor | ............ | E05B 65/464 312/221 |
| 5,599,078 A * | 2/1997 | Dechene | ............... | E05B 65/464 312/217 |
| 5,702,167 A * | 12/1997 | Muller | .................. | E05B 65/464 312/217 |
| 6,568,771 B2 * | 5/2003 | Gentili | .................. | E05B 65/464 312/217 |
| 6,749,274 B2 * | 6/2004 | Westwinkel | .......... | E05B 65/464 312/221 |
| 2022/0141985 A1 * | 5/2022 | Chang | .................. | H05K 7/1489 361/725 |

* cited by examiner

RACK INTERLOCK AND ANTI-TIPPING MECHANISM

BACKGROUND

In systems with multiple rack-mounted devices, each slot within a rack is typically accessible individually for the removal or installation of a device, e.g., a server. During service or installation, a device may then be partially inserted into, or withdrawn from, its slot. The partial insertion of the device results in that being cantilevered from the rack, which creates a tipping moment. With each device having the potential to be in the partially-inserted position, it creates the potential that the sum of the tipping moments may cause the rack to topple.

Similarly, seismic events may dislodge one or more devices and cause them to be partially inserted. This may again create the potential that the sum of the tipping moments may cause the rack to topple.

Thus, what is needed is an apparatus that limits the number of devices that may be partially-inserted, thereby limiting the tipping moment that may be applied to the rack by devices and improving the stability of the rack during both normal operation and seismic events.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within describe an interlock system designed to limit the number of racked devices that may be removed and, potentially, remain extended from the rack such that the extended device creates a tipping moment. In an embodiment, the number of devices allowed to be removed is limited to one. As a result, the potential tipping moment is limited to that created by one device being extended from the rack. In an embodiment, a plurality of separate interlock systems may be applied to a single rack to allow for a plurality of devices to be removed simultaneously. In embodiments, the number of devices that may be removed is determined by the weight of each device and rack and the number of devices that may be extended from the rack without causing the rack to topple. Such embodiments also provide a fail-safe that limits the number of devices that may be dislodged during a seismic event.

Embodiments may be applied to any rack-able system, multiple heights, and any configuration. Generally, embodiments may be fit to a rack provided the rack and device combination allows sufficient space above or below the rack side rail to mount a small external block to the device, for each device of the rack and have that block slide in and out with the device. System installation does not interfere with airflow or interface wiring on the front or rear of the rack. Thus, embodiments may be standardized and applied across different rack platforms.

In an embodiment, the block is a trigger, of sorts, that rotates a shaft with the removal of the device. The shaft in turn rotates paddles oriented about the shaft such that removal of a device causes the block to come against and rotate a trigger paddle. For each device slot of the rack, a pair of trigger and locking paddles are attached to the shaft and configured to work with a device in the slot. On removal of a first device, the rotation of the trigger paddle associated with that slot causes a locking paddle associated with a second slot to rotate into an extended position that prevents removal of the associated device by impeding the travel of the block of the associated device. In an embodiment, the shaft that can be vertically mounted on the left, right, or both sides of a four post rack to prevent devices from being removed after an initial device is removed. In an embodiment, shaft 102 may be hexagonal or have relief cut areas to allow the use of an open end wrench to manually rotate, but have cylindrical areas where it is mounted with bearings, e.g., within brackets 110, 120, 130.

In an embodiment, the block may be incorporated into the device itself, e.g., on the device chassis side or rail. However, a benefit of embodiments in which the block is removable is that removing the block from any particular device means that the device will be "ignored" by the system, i.e., the particular device may be removed or inserted without activating the interlock and regardless of the state of the interlock.

Figure 1:
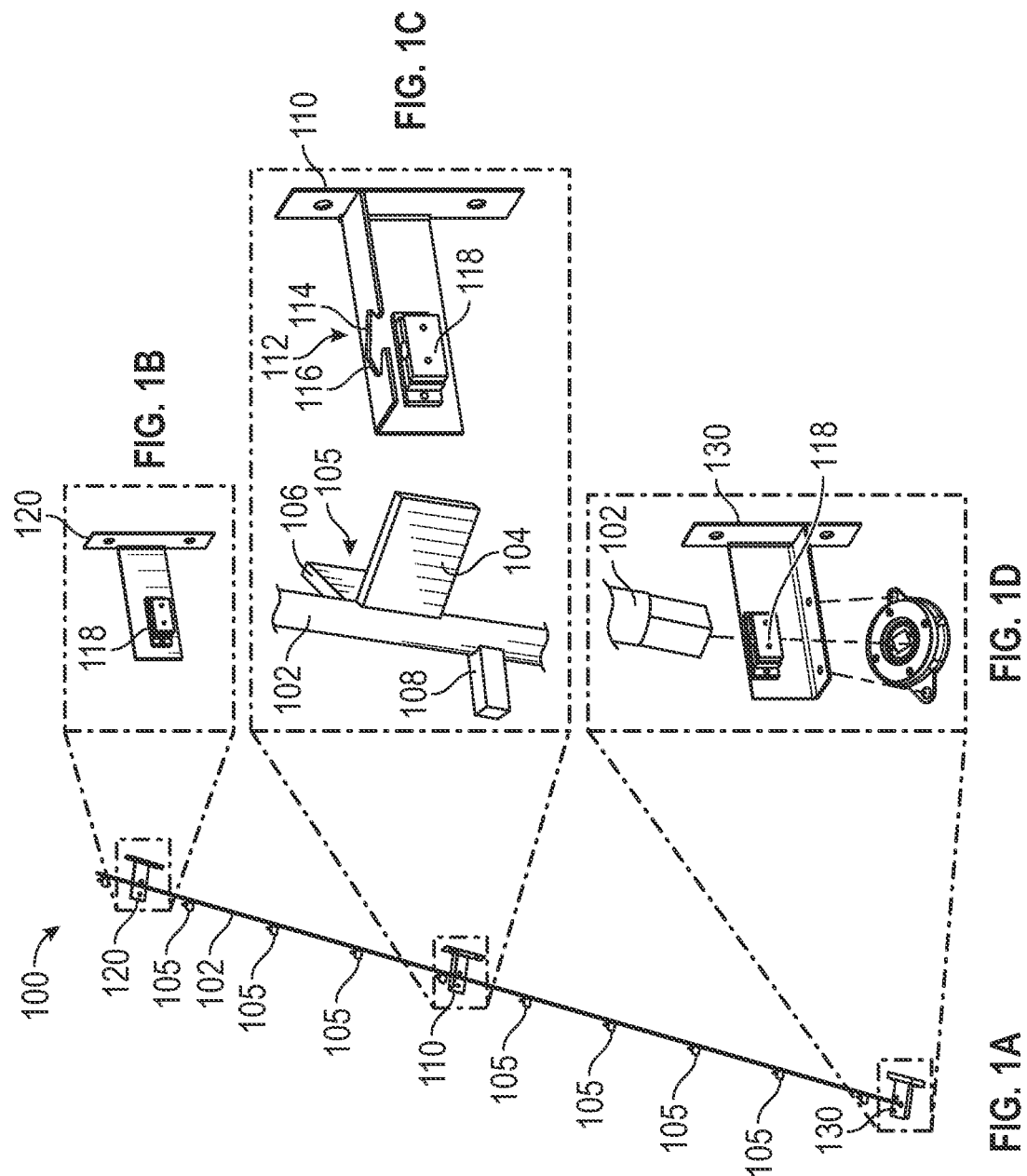
FIG. 1A is an isometric view illustrating an interlock system according to an embodiment.
FIG. 1B-FIG. 1D are isometric views illustrating elements of FIG. 1A.
Figure 8:
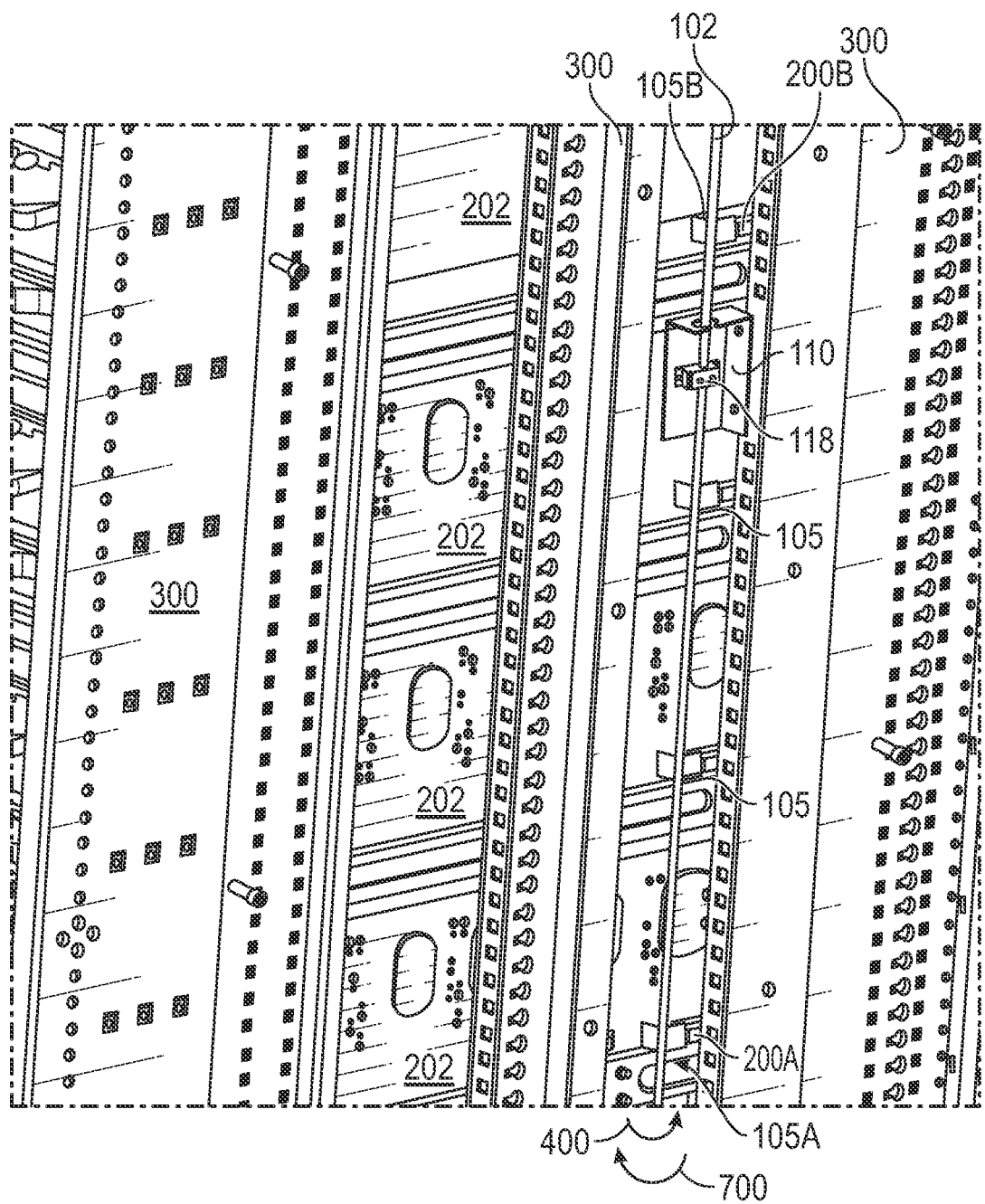
FIG. 8 is an isometric side view illustrating aspects of the use case for an interlock system of FIG. 2.

FIG. 1A is an isometric view illustrating an interlock system 100 according to an embodiment. FIGS. 1B-1D illustrate in further detail the indicated sections of FIG. 1A. In FIGS. 1A-1D, interlock system 100 includes a shaft 102 upon which paddle pairs 105 are provided in positions along shaft 102 that correspond to devices 202 (FIGS. 2, 3, and 8) within a rack 300 (FIGS. 3 and 8). Interlock system 100 may include an upper bracket 120, a middle bracket 110, and a lower bracket 130, which are attached to rack 300. Each bracket may be provided with a bearing 118, within which shaft 102 rotates. Lower bracket 130 may be further equipped a rotational damper 134. Paddle pairs 105 each include a locking paddle 104 and a trigger paddle 106. At a position along shaft 102 that corresponds to middle bracket 110, a limiting arm 108 is provided. In embodiments, one or more pairs of limiting arms 108 and associated middle brackets 110 may be included. Middle bracket 110 is provided with an arm window 112 within which arm 108 is configured to move with rotation of shaft 102, between a stop position 114 (indicating system lock) and a stop position 116 (indicating system unlock).

Figure 2:
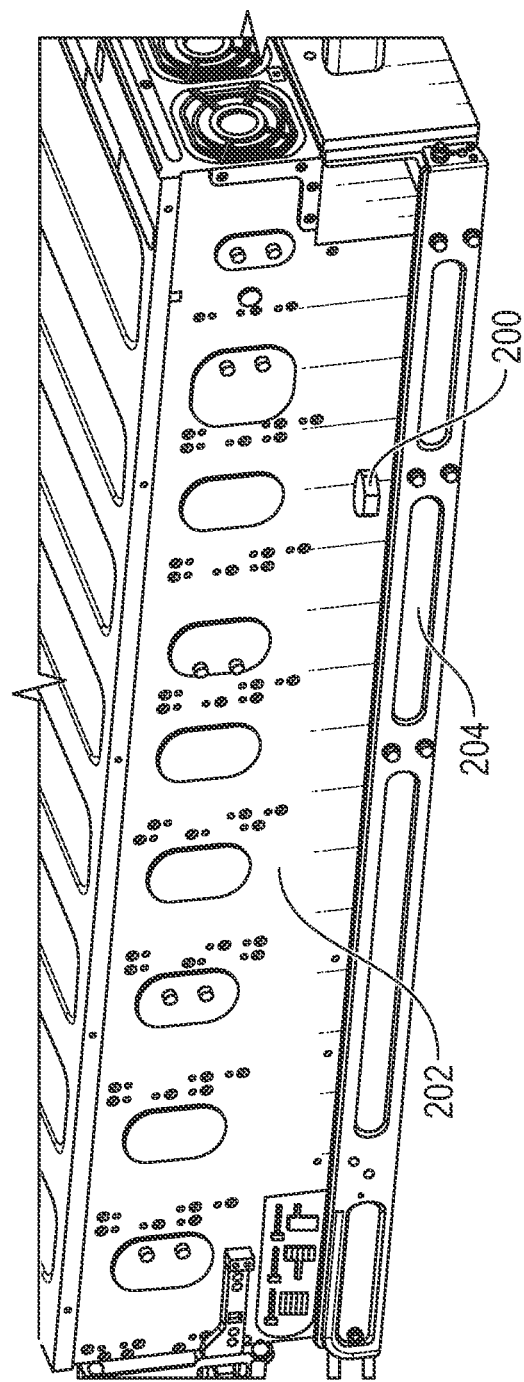
FIG. 2 is an isometric left side view illustrating aspects of a use case for an interlock system according to an embodiment.
Figure 3:
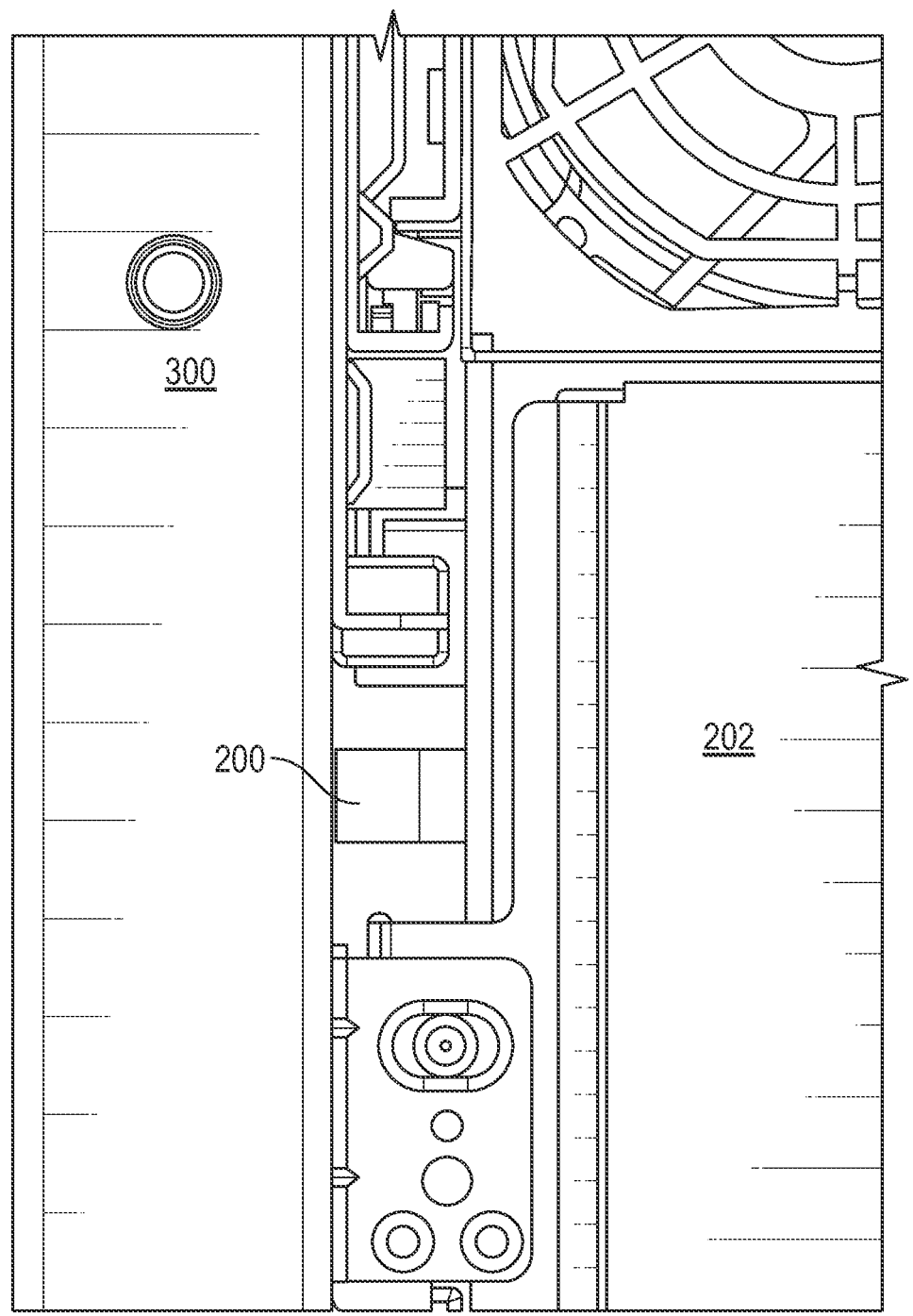
FIG. 3 is an isometric rear view illustrating aspects of the use case for an interlock system of FIG. 2.

FIG. 2 is an isometric left side view illustrating aspects of a use case for interlock system 100 according to an embodiment. In FIG. 2, interlock system 100 is shown to further include a block 200 attached to a device 202. Device 202 may be, e.g., a server, and slide within a rack slot on a rail 204.

FIG. 3 is an isometric rear view illustrating aspects of the use case for interlock system 100 of FIG. 2. In FIG. 3, block 200 is shown attached to device 202 within rack 300. As illustrated, block 200 may slide into and out of rack 300 (into or out of the page) without hindrance. Not shown is locking paddle 104 or trigger paddle 106, one of which would be visible behind block 200 if shaft 102 were installed.

Figure 4:
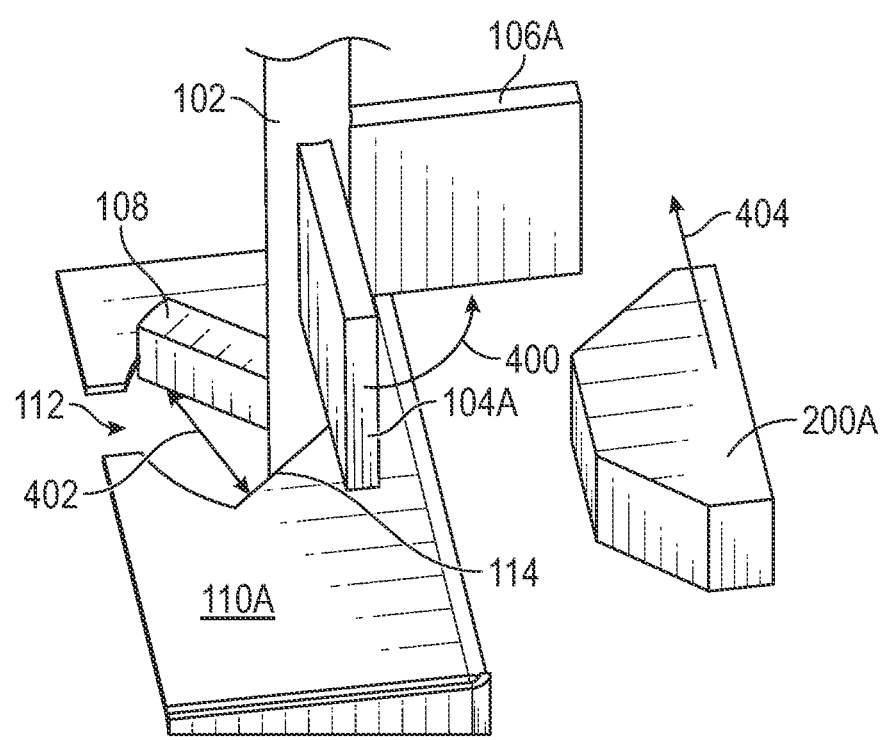
FIG. 4 is an isometric view illustrating aspects of the embodiment of FIG. 1A.

FIG. 4 is an isometric view illustrating aspects of the embodiment of interlock system 100 of FIG. 1A. FIGS. 4-7 illustrate the functioning of interlock system 100. In FIG. 4, a block 200A corresponds to a first device (not shown) and a locking paddle 104A and a trigger paddle 106A correspond to the position of the first device. As block 200A is withdrawn from the rack in direction 404, it encounters trigger paddle 106A.

Figure 5:
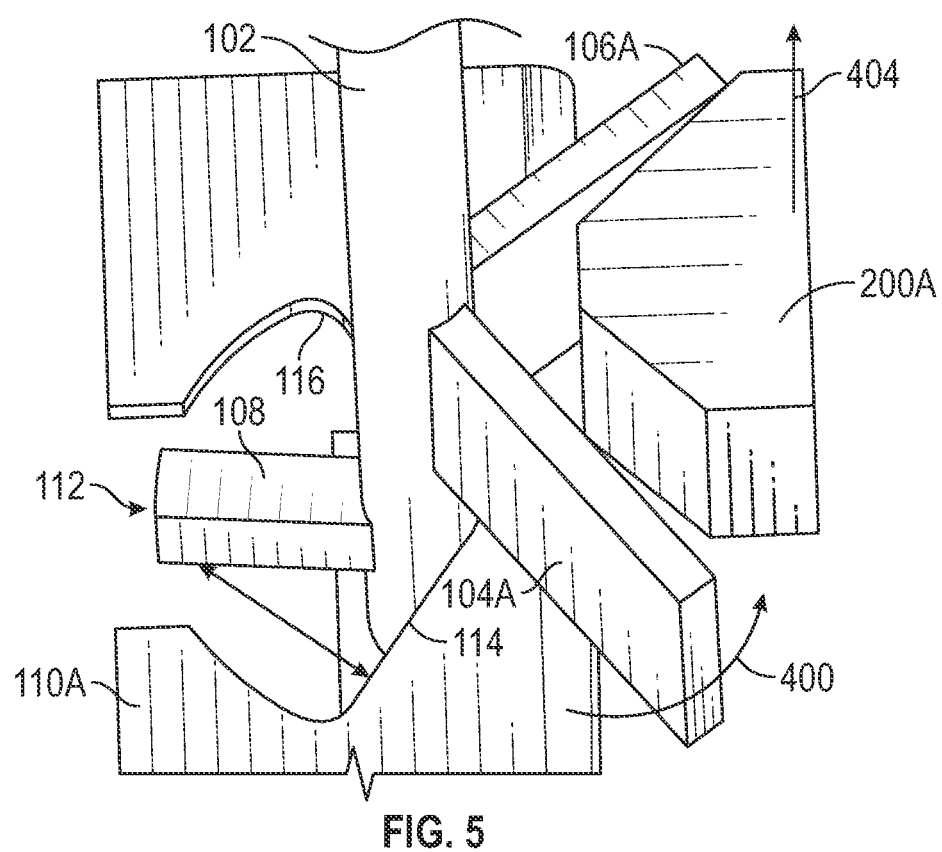
FIG. 5 is an isometric view illustrating aspects of the embodiment of FIG. 1A.

Now with regard to FIG. 5, further movement of block 200A in direction 404 causes shaft 102 to rotate 400 counterclockwise within a middle bracket 110A and paddle 106A to retract. Thus, with further rotation of shaft 102, block 200A may eventually pass by paddle 106A. That same rotation causes locking paddle 104A to rotate 400 and extend into the space previously occupied by paddle 106A. And that same rotation 400 causes arm 108 to move from an unlocked stop position 116 toward a locked stop position 114, decreasing a distance 402. No further rotation 400 is possible once arm 108 abuts stop position 114 and interlock system 100 is now locked such that no other devices may be removed from rack 300 provided those devices are equipped with a block 200.

Figure 6:
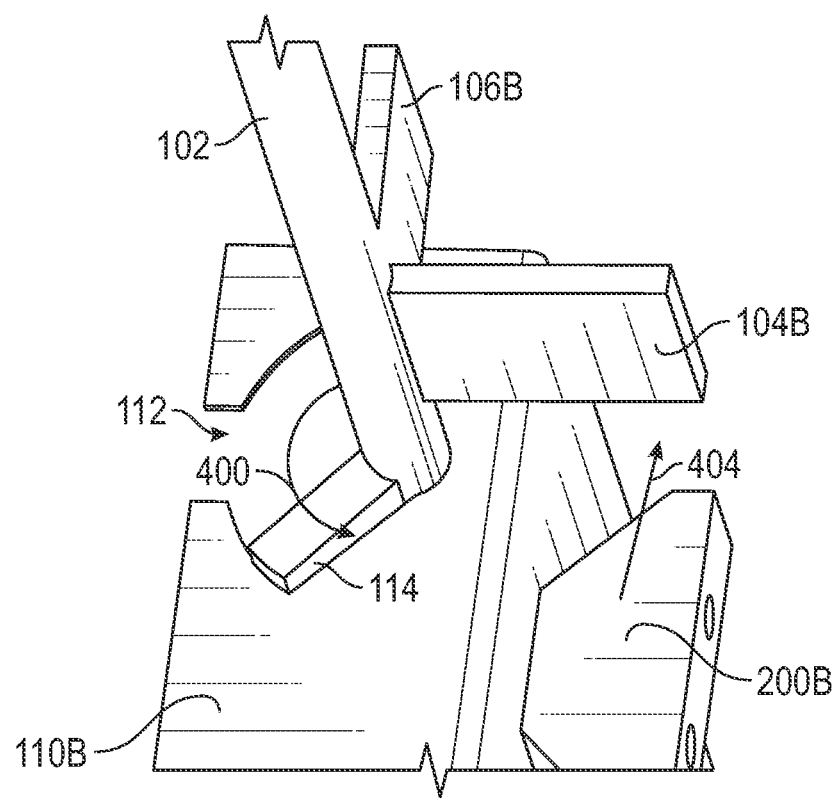
FIG. 6 is an isometric view illustrating aspects of the embodiment of FIG. 1A.

FIG. 6 illustrates the locking aspect of interlock system 100. In FIG. 6, a block 200B is associated with a device (not shown) within a slot of now-locked rack 300. The rotation 400 of shaft 102 caused by paddle 106A has moved locking paddle 104B into the lock position. To remove a device in the slot of FIG. 6 would require block 200B to move in direction 404 and past a locking paddle 104B. However, with arm 108 abutting stop 114, no further rotation 400 is allowed. Thus, locking paddle 104B prevents movement of block 200B in direction 404, which in turn prevents the associated device from being removed from the slot. Note that FIG. 6 includes a second middle bracket 110B to help illustrate the workings of the system, but a single middle bracket 110A would be sufficient to constrain rotation of shaft 102.

Figure 7:
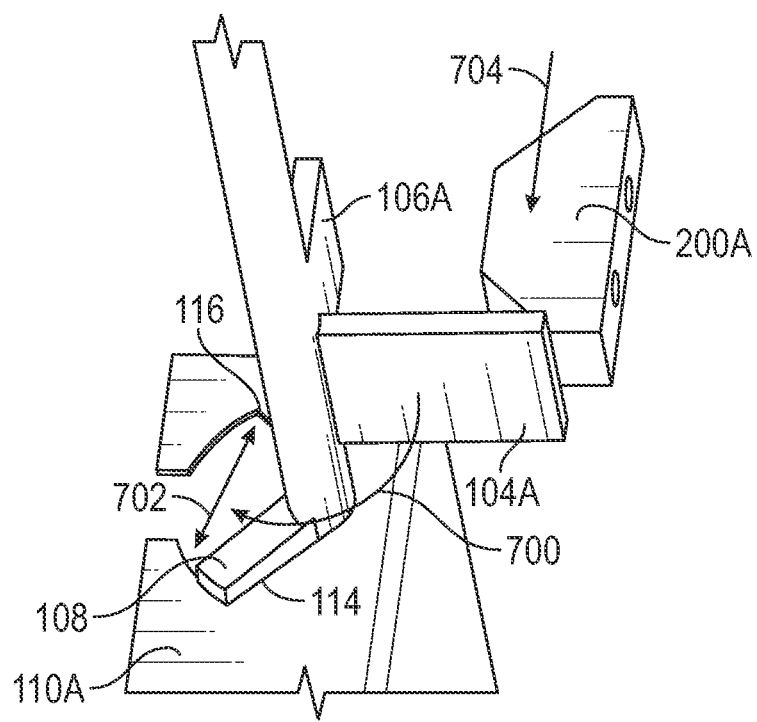
FIG. 7 is an isometric view illustrating aspects of the embodiment of FIG. 1A.

FIG. 7 illustrates the unlocking aspect of interlock system 100. In FIG. 7, block 200A and the associated device are being re-installed in the rack in direction 704. On block 200A encountering locking paddle 104A, further movement 704 causes shaft 102 to rotate 700 and swing arm from stop 114 toward unlocked stop 116, decreasing a distance 702. When block 200A has been fully inserted, arm 104A will have rotated 700 clockwise until trigger arm 106A has returned to the position of FIG. 4. Simultaneously, all other locking arms (e.g., 104B) on shaft 102 will also rotate 700 until no block or associated device is prevented from being withdrawn. Interlock system 100 is now unlocked and reset—allowing for a single device to be removed without hindrance.

FIG. 1C and FIG. 4-FIG. 7 are illustrated with paddles 104, 106 (and A and B versions) with an angular spacing of 90 degrees about shaft 102. However, in embodiments the angular spacing could vary depending on the size of block 200, and how block 200 interacts with paddles 104, 106. For example, where the dimensions of device 202 and rack 300 permit a relatively larger block and paddle combination, the angle of sweep caused by block 200 moving against and then past a paddle (104 or 106) may allow for a relatively larger angular spacing between paddles 104, 106. In contrast, where dimensions permit a relatively smaller block and paddle combination, the angle of sweep may allow for a relatively smaller angular spacing between paddles. In such embodiments, the movement of limiting arm 108 is adjusted to correspond to the angle of sweep by adjusting the angle between stops 114, 116.

FIG. 8 is an isometric side view illustrating aspects of the use case for an interlock system 100 of FIG. 2. FIG. 8 illustrates that each of a plurality of devices 202 has an associated paddle set, e.g., paddle sets 105A, 105B, and a block, e.g., blocks 200A, 200B. FIG. 8 further illustrates that interlock system 100 may be positioned unobtrusively in unused space between elements of rack 300 and still provide the ability to remove one device 202 from rack 300 and simultaneously lock the remaining devices 202 within rack 300.

Note that to load more than one device 202 into rack 300, shaft 102 must be raised within bearings 118 so that paddle sets 105A, 105B do not align with blocks 200A, 200B. Once devices 202 are installed, shaft 102 may be lowered such that each paddle set 105A, 105B is at the level of the associated block 200A, 200B. When lowering shaft 102, after installing devices 200A, 200B, shaft 102 should be rotated such that the plurality of trigger paddles extend toward the devices and the plurality of locking paddles run roughly parallel to the device sides. In an embodiment, shaft 102 may be configured to be locked in both a raised and a lowered position using.

In an embodiment, if extra strength is needed, a second interlock system 100 could be installed on the other side of rack 300. To accommodate the second system, shafts 102 and paddle sets 105 would need to rotate in opposite directions with movement of the devices 202, i.e., if one shaft rotates clockwise the other would rotate counter clockwise.

In an embodiment, rotational damper 134 may be configured to accommodate irregular block speeds and contact with paddle sets 105, e.g., providing for a "soft" closing or opening rotation of shaft 102.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a shaft;
an arm extending radially from the shaft;
a plurality of sets of paddles disposed along the shaft, each set of paddles rotating with rotation of the shaft and including a trigger paddle extending radially from the shaft and a locking paddle extending radially from the shaft; and
a bracket configured to constrain rotation of the arm about a shaft axis such that rotation of the shaft about the shaft axis is constrained to rotation between first and second shaft positions, wherein, when the shaft is affixed to a rack such that the shaft rotates about an axis that is perpendicular to a direction of insertion or removal of a device into or from a device slot:
when the shaft is in the first shaft position, each locking paddle of the plurality of locking paddles extends toward an associated device slot; and
when the shaft is rotated from the first shaft position to the second shaft position, each locking paddle is rotated away from the associated device slot and each trigger paddle is rotated to extend toward the associated device slot.

2. The apparatus of claim 1 further including a block configured to attach to the device, wherein, when the block is connected to the device and the shaft is in the first shaft position with each of the plurality of locking paddles extending toward the associated device slot:
as the device is slid into one of the device slots, the block abuts the locking paddle associated with the device slot; and
further movement of the device into the device slot causes the block to move the arm, the movement causing the shaft to rotate from the first shaft position to the second shaft position.

3. The apparatus of claim 1, wherein the shaft is cylindrical.

4. The apparatus of claim 1, wherein the trigger paddle and the locking paddle for each paddle set extend radially from a common section of the shaft and are separated by an angular spacing such that when the shaft is in the first shaft position the plurality of locking paddles are oriented perpendicularly to the device slot and the when the shaft is in the second shaft position the plurality of trigger paddles are oriented perpendicularly to the device slot.

5. The apparatus of claim 4, wherein the angular spacing is ninety degrees.

6. The apparatus of claim 1, wherein the shaft is received through a slot in the bracket into a corner between a first bracket edge and a second bracket edge, and the first bracket edge and the second bracket edge constrain the rotation of the arm.

7. The apparatus of claim 1, further comprising:
a first end bracket including a first bearing within which the shaft rotates; and
a second end bracket including a second bearing, wherein:
the first end bracket receives a first end of the shaft and the second end bracket receives a second end of the shaft; and
the arm is located on the shaft between the first end of the shaft and the second end of the shaft.

8. An apparatus comprising:
a rack including a plurality of device slots, each slot configured to accept a device provided with a block on a first side of the device;
a shaft connected to the rack such that the shaft rotates about an axis that is perpendicular to a direction of insertion or removal of the device into or from the device slot;
an arm extending radially from the shaft;
a plurality of sets of paddles disposed along the shaft, each set of paddles rotating with rotation of the shaft and including a trigger paddle extending radially from the shaft and a locking paddle extending radially from the shaft;
a bracket connecting the shaft to the rack, the bracket provided with first and second stops configured to constrain rotation of the arm about a shaft axis such that rotation of the shaft about the shaft axis is constrained to rotation between first and second shaft positions, wherein,
when the shaft is in the first shaft position, each locking paddle of the plurality of locking paddles extends toward an associated device slot; and
when the shaft is rotated from the first shaft position to the second shaft position, each locking paddle is rotated away from the associated device slot and each trigger paddle is rotated to extend toward the associated device slot.

9. The apparatus of claim 8, wherein, when the shaft is in the first shaft position with the plurality of locking paddles extending toward the associated device slot:
as the device is slid into one of the device slots, the block abuts the locking paddle associated with the device slot; and
further movement of the device into the device slot causes the block to move the arm, the movement causing the shaft to rotate from the first shaft position to the second shaft position.

10. The apparatus of claim 8, wherein the shaft is cylindrical.

11. The apparatus of claim 8, wherein the trigger paddle and the locking paddle for each paddle set extend radially from a common section of the shaft and are separated by an angular spacing such that when the shaft is in the first shaft position the plurality of locking paddles are oriented perpendicularly to the device slot and the when the shaft is in the second shaft position the plurality of trigger paddles are oriented perpendicularly to the device slot.

12. The apparatus of claim 11, wherein the angular spacing is ninety degrees.

13. The apparatus of claim 8, wherein the shaft is received through a slot in the bracket into a corner between a first bracket edge and a second bracket edge, and the first bracket edge and the second bracket edge constrain the rotation of the arm.

14. The apparatus of claim 8, further comprising:
a first end bracket connected to the rack; and
a second end bracket connected to the rack, wherein:
the shaft is connected to the rack by the first end bracket receiving a first end of the shaft and the second end bracket receiving a second end of the shaft;

the arm is located on the shaft between the first end of the shaft and the second end of the shaft.

* * * * *